(12) United States Patent
Tokuhiro et al.

(10) Patent No.: US 8,547,133 B2
(45) Date of Patent: Oct. 1, 2013

(54) SEMICONDUCTOR DEVICE, CIRCUIT BOARD DEVICE, AND INFORMATION PROCESSING DEVICE

(75) Inventors: Noriyuki Tokuhiro, Kawasaki (JP); Kazumasa Kubotera, Kawasaki (JP); Yasutaka Kanayama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/239,877

(22) Filed: Sep. 22, 2011

(65) Prior Publication Data
US 2012/0153988 A1 Jun. 21, 2012

(30) Foreign Application Priority Data
Dec. 15, 2010 (JP) .................................. 2010-278797

(51) Int. Cl.
*H03K 17/16* (2006.01)
(52) U.S. Cl.
USPC .............................................. 326/30; 326/86
(58) Field of Classification Search
USPC .................. 326/21, 30, 86; 327/108–112
See application file for complete search history.

(56) References Cited

U.S. PATENT DOCUMENTS

| | | | | |
|---|---|---|---|---|
| 5,719,856 A * | 2/1998 | May | ............................. | 370/282 |
| 6,239,617 B1 * | 5/2001 | Guertin et al. | .................. | 326/81 |
| 6,356,106 B1 * | 3/2002 | Greeff et al. | .................... | 326/30 |
| 7,193,431 B2 | 3/2007 | Miyake et al. | | |
| 7,295,033 B2 * | 11/2007 | Chung et al. | .................... | 326/30 |
| 7,755,366 B2 | 7/2010 | Hosoe et al. | | |
| 2008/0150585 A1 * | 6/2008 | Warner et al. | ................... | 326/90 |
| 2009/0243748 A1 * | 10/2009 | Kinoshita et al. | ............ | 333/17.3 |
| 2010/0188058 A1 * | 7/2010 | Dimitriu et al. | .............. | 323/233 |
| 2011/0267100 A1 * | 11/2011 | Koo | ............................... | 326/30 |

FOREIGN PATENT DOCUMENTS

| | | |
|---|---|---|
| JP | 2006-66833 A | 3/2006 |
| JP | 2008-60629 A | 3/2008 |

OTHER PUBLICATIONS

DDR3: Frequently Asked Questions, 2007, Kingston Technology, available at http://legacy.kingston.com/channelmarketingcenter/hyperx/literature/MKF_1223_DDR3_FAQ.pdf.*

* cited by examiner

*Primary Examiner* — Vibol Tan
(74) *Attorney, Agent, or Firm* — Fujitsu Patent Center

(57) ABSTRACT

In a semiconductor device, a selector selects a different reference voltage depending on whether the impedance of a transmitter or of a receiver is to be adjusted, and causes a reference voltage generator to generate the selected reference voltage. The reference voltage generator generates the reference voltage selected by the selector and applies the generated reference voltage to an impedance adjuster. The impedance adjuster adjusts the impedance of the transmitter and the impedance of the receiver, separately from each other, in accordance with the input reference voltage.

7 Claims, 10 Drawing Sheets

SEMICONDUCTOR DEVICE, CIRCUIT BOARD DEVICE, AND INFORMATION PROCESSING DEVICE

CROSS-REFERENCE TO RELATED APPLICATION

This application is based upon and claims the benefit of priority of the prior Japanese Patent Application No. 2010-278797, filed on Dec. 15, 2010, the entire contents of which are incorporated herein by reference.

FIELD

The embodiments discussed herein are related to semiconductor devices, circuit board devices, and information processing devices.

BACKGROUND

As standards for high-speed memory interfaces, the JEDEC (Joint Electron Device Engineering Council) standards (JESD79-3E) for DDR3 (Double-Data-Rate 3) interface, for example, have been known. Such interfaces are standardized so that the transmitting impedance of an output driver (hereinafter referred to as transmitter) and the terminating impedance of a receiver may each be equal to a multiple (or a submultiple) of a fixed resistance value as a reference value.

Where an interface is implemented using a semiconductor, the transmitting impedance or terminating impedance of the interface greatly varies depending on manufacturing (process) variations, power supply voltage during use, and temperature changes. Thus, it has been conventionally known to adjust the impedances of an interface circuit by using, as a reference value, the resistance value of a reference resistor connected externally to the semiconductors.
Japanese Laid-open Patent Publication No. 2008-60629
Japanese Laid-open Patent Publication No. 2006-66833

Meanwhile, where the transmitting impedance of the transmitter and the terminating impedance of the receiver are to be set to respective different values in order to improve the transmission waveform or the like, for example, the transmitter and the receiver may each be provided with an impedance adjustment circuit and an external reference resistor so that their impedances can be set to different values.

In this case, however, a problem arises in that the size of circuitry increases.

SUMMARY

According to one aspect of the present invention, there is provided a semiconductor device including a transmitter configured to transmit information, a receiver configured to receive information, an impedance adjuster configured to adjust an impedance of the transmitter and an impedance of the receiver, separately from each other, in accordance with a reference voltage input thereto, a reference voltage generator configured to generate the reference voltage and supply the generated reference voltage to the impedance adjuster, and a selector configured to select a different reference voltage depending on whether the impedance of the transmitter or of the receiver is to be adjusted, and cause the reference voltage generator to generate the selected reference voltage.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
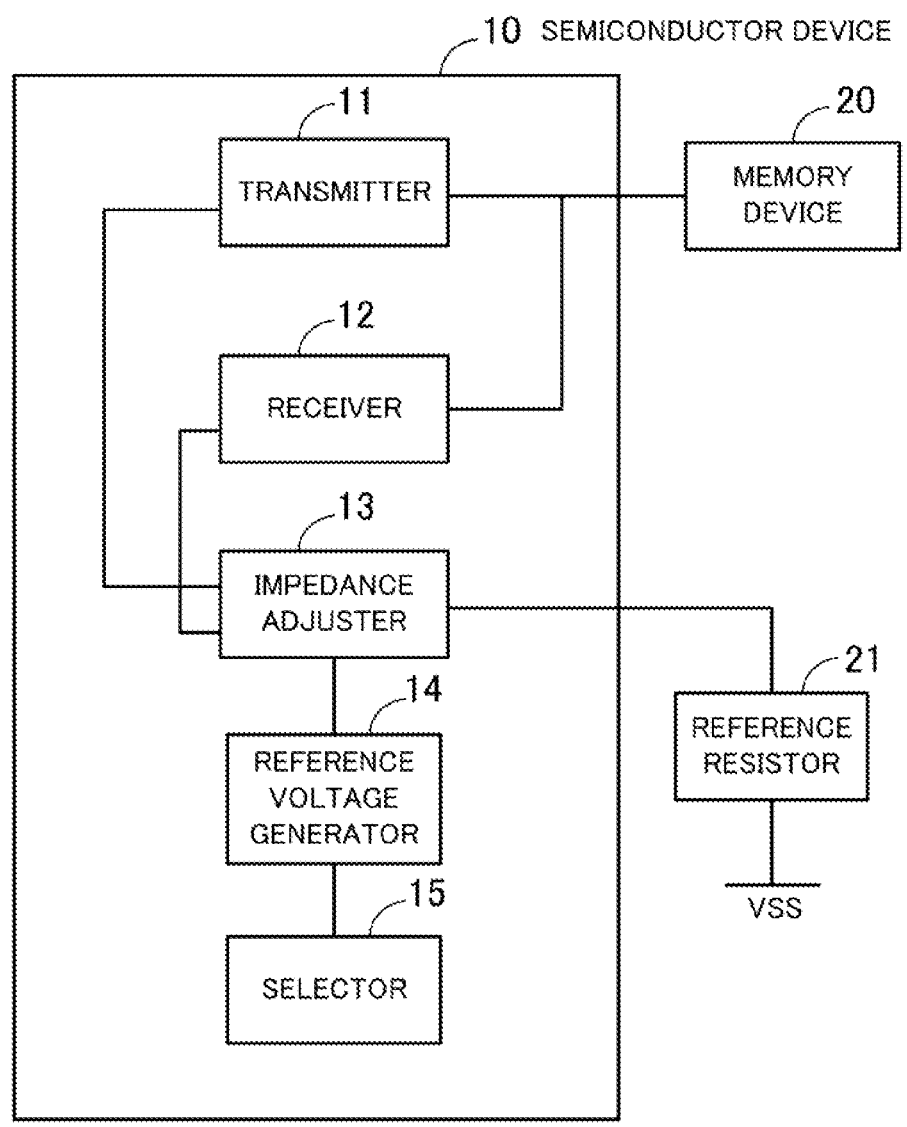
FIG. 1 illustrates an example of a semiconductor device according to a first embodiment.

Embodiments of the present invention will be described below with reference to the accompanying drawings, wherein like reference numerals refer to like elements throughout.

[a] First Embodiment

FIG. 1 illustrates an example of a semiconductor device according to a first embodiment.

The semiconductor device 10 is an LSI (Large Scale Integrated circuit) chip in a memory controller for controlling a memory device 20, for example, and includes a transmitter 11, a receiver 12, an impedance adjuster 13, a reference voltage generator 14, and a selector 15.

The transmitter 11 sends, to the memory device 20, information received, for example, from a processor unit, not illustrated in FIG. 1. The receiver 12 receives information from the memory device 20.

The impedance adjuster 13 adjusts the impedances of the transmitter 11 and the receiver 12 separately from each other, in accordance with a reference voltage input thereto from the reference voltage generator and the resistance of an external reference resistor (one end of which is connected to a VSS power supply, for example).

The reference voltage generator 14 generates the reference voltage and supplies the generated reference voltage to the impedance adjuster 13.

The selector 15 selects a different reference voltage depending on whether the impedance of the transmitter 11 or of the receiver 12 is to be adjusted, and causes the reference voltage generator 14 to generate the selected reference voltage. For example, the selector receives control signals for generating respective different reference voltages, selects an applicable control signal depending on whether the impedance of the transmitter 11 or of the receiver 12 is to be adjusted, and supplies the selected control signal to the reference voltage generator 14.

The transmitter 11 or the receiver 12, of which the impedance is to be adjusted, is designated by a selection signal from a controller, not illustrated in FIG. 1 (details will be described later).}

The operation of the semiconductor device 10 will be now explained.

When the impedance of the transmitter 11 is to be adjusted, the selector 15 selects a reference voltage for adjusting the impedance of the transmitter 11, and the reference voltage generator 14 generates the selected reference voltage. The impedance adjuster 13 adjusts the impedance of the transmitter 11 in accordance with the reference voltage generated by the reference voltage generator 14 and the resistance of the external reference resistor 21.

On the other hand, when the impedance of the receiver 12 is to be adjusted, the selector 15 selects a reference voltage for adjusting the impedance of the receiver 12, and the reference voltage generator 14 generates the selected reference voltage. In accordance with the reference voltage generated by the reference voltage generator 14 and the resistance of the external reference resistor 21, the impedance adjuster 13 adjusts the impedance of the receiver 12. The impedance adjuster 13 and the operation thereof will be described in detail later.

As stated above, the impedance of the transmitter 11 and that of the receiver 12 are adjusted separately from each other in accordance with the reference voltage value selected by the selector 15. This makes it possible to set the impedances of the transmitter 11 and the receiver 12 to respective different values and also to adjust the impedances so as to be best suited for the transmission and the reception. Further, since the transmitter 11 and the receiver 12 need not individually be provided with an impedance adjustment circuit and a reference resistor for the purpose of impedance setting, the circuit size can be reduced, so that corresponding reduction of the power consumption is expected.

[b] Second Embodiment

Figure 2:
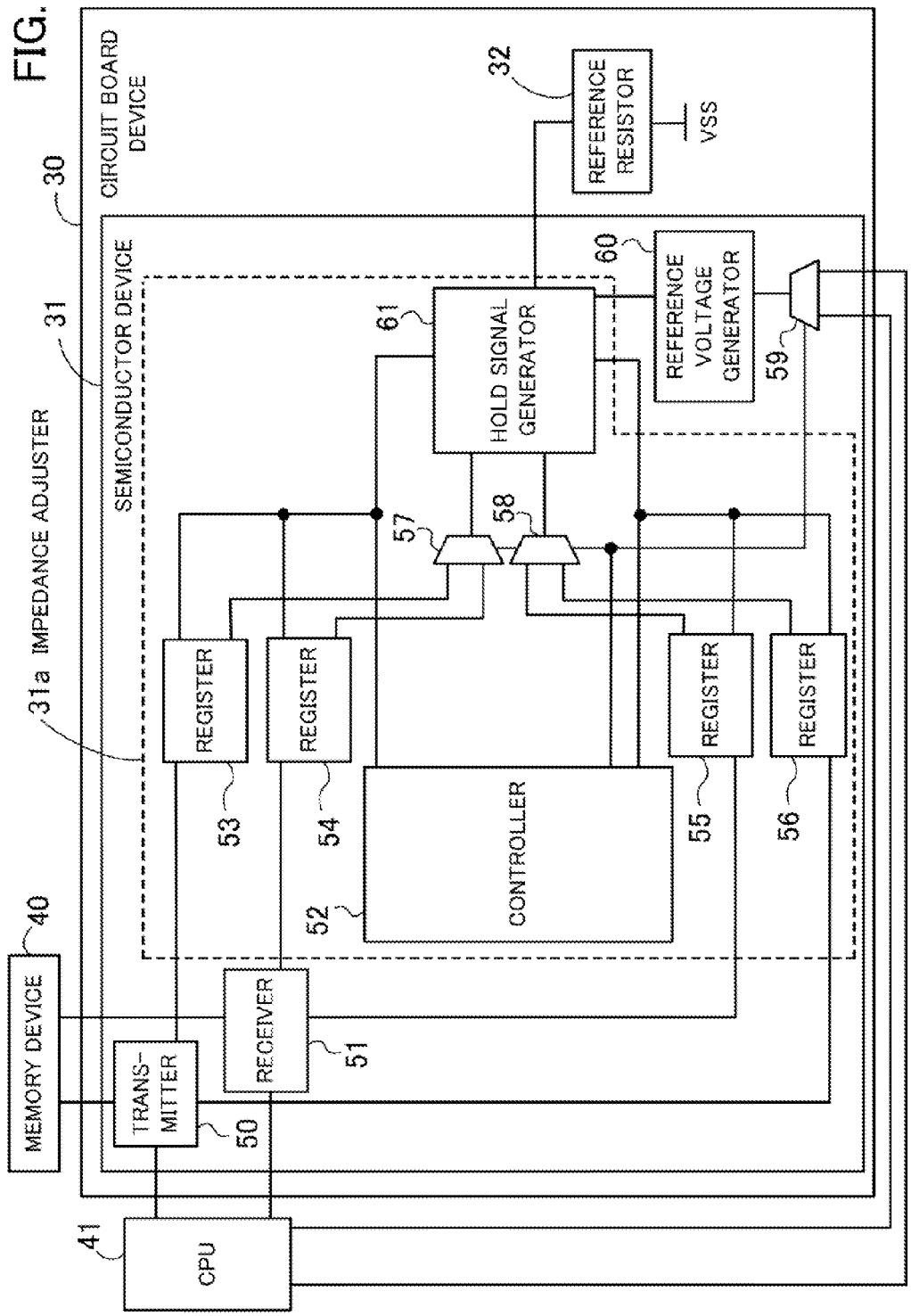
FIG. 2 illustrates a circuit board device according to an embodiment.

FIG. 2 illustrates a circuit board device according to an embodiment.

The circuit board device 30 is, for example, a memory controller for controlling a memory device 40 such as a DDR SDRAM (Synchronous Dynamic Random Access Memory), or a motherboard having the function of controlling the memory device 40. As illustrated in FIG. 2, the circuit board device 30 includes a semiconductor device 31, and a reference resistor 32 having one end connected to a VSS power supply.

The semiconductor device 31, which has the same functions as those of the semiconductor device 10 illustrated in FIG. 1, includes a transmitter 50, a receiver 51, a controller 52, registers 53, 54, 55 and 56, selectors 57, 58 and 59, a reference voltage generator 60, and a hold signal generator 61. In the example illustrated in FIG. 2, the controller 52, the registers 53 to 56, the selectors 57 and 58 and the hold signal generator 61 function as an impedance adjuster 31a.

The transmitter 50 is an output driver of a memory controller, for example, and sends, to the memory device 40, transmit data received from a CPU (Central Processing Unit) 41. The transmitter 50 includes a switch element having a plurality of p-channel MOSFETs (Metal-Oxide-Semiconductor Field-Effect Transistors) (hereinafter abbreviated as pMOSs), and a switch element having a plurality of n-channel MOSFETs (hereinafter abbreviated as nMOSs).

The receiver 51 receives data from the memory device 40 and sends the received data to, for example, the CPU 41. The receiver 51 includes, as a terminating resistor, a switch element having a plurality of pMOSs and a switch element having a plurality of nMOSs, like the transmitter 50.

The controller 52 outputs, to the selectors 57 to 59, a selection signal indicating whether the impedance of the transmitter 50 or the receiver 51 is to be adjusted. The controller 52 controls the impedance adjuster 31a in accordance with a clock signal, for example, so that the adjustment of the impedance of the transmitter 50 and the adjustment of the impedance of the receiver 51 may be repeated at regular intervals of time. Also, the controller 52 outputs, to the registers 53 to 56 and the hold signal generator 61, a control signal which is common to the transmitter 50 and the receiver 51 and is used for adjusting the impedances of the transmitter 50 and the receiver 51.

In this embodiment, two kinds of control signals are used. One is a control signal (hereinafter referred to as pMOS control signal) for adjusting the impedance by controlling the number of the pMOSs used in the respective switch elements of the transmitter 50 and the receiver 51, and the other is a control signal (hereinafter referred to as nMOS control signal) for adjusting the impedance by controlling the number of the nMOSs used in the respective switch elements of the transmitter 50 and the receiver 51. The numbers of the pMOSs and nMOSs used in the respective switch elements of the transmitter 50 and the receiver 51 are determined by the pMOS and nMOS control signals, respectively, to adjust the impedances.

When one hold signal (hereinafter referred to as pMOS-side hold signal) output from the hold signal generator 61 is input to the register 53 via the selector 57, the register 53 holds the pMOS control signal output from the controller 52 to the transmitter 50. The pMOS-side hold signal is selected by the selector 57 and input to the register 53 when the impedance of the transmitter 50 is adjusted. Thus, the pMOS-side hold signal input to the register 53 from the hold signal generator 61 is timed depending on the reference voltage for adjusting the impedance of the transmitter 50.

When the pMOS-side hold signal output from the hold signal generator 61 is input to the register 54 via the selector 57, the register 54 holds the pMOS control signal output from the controller 52 to the receiver 51. The pMOS-side hold signal is selected by the selector 57 and input to the register 54 when the impedance of the receiver 51 is adjusted. Accordingly, the pMOS-side hold signal input to the register 54 from the hold signal generator 61 is timed depending on the reference voltage for adjusting the impedance of the receiver 51.

When the other hold signal (hereinafter referred to as nMOS-side hold signal) output from the hold signal generator 61 is input to the register 55 via the selector 58, the register 55 holds the nMOS control signal output from the controller 52 to the receiver 51. The nMOS-side hold signal is selected by the selector 58 and input to the register 55 when the impedance of the receiver 51 is adjusted. Thus, the nMOS-side hold signal input to the register 55 from the hold signal generator 61 is timed depending on the reference voltage for adjusting the impedance of the receiver 51.

When the nMOS-side hold signal output from the hold signal generator 61 is input to the register 56 via the selector 58, the register 56 holds the nMOS control signal output from the controller 52 to the transmitter 50. The nMOS-side hold signal is selected by the selector 58 and input to the register 56 when the impedance of the transmitter 50 is adjusted. Accordingly, the nMOS-side hold signal input to the register 56 from the hold signal generator 61 is timed depending on the reference voltage for adjusting the impedance of the transmitter 50.

The registers 53 to 56 are each implemented using a flip-flop, for example.

The selector 57 outputs the pMOS-side hold signal received from the hold signal generator 61 to either the register 53 or the register 54 depending on whether the impedance of the transmitter 50 or the receiver 51 is to be adjusted.

The selector 58 outputs the nMOS-side hold signal received from the hold signal generator 61 to either the register 55 or the register 56 depending on whether the impedance of the receiver 51 or the transmitter 50 is to be adjusted.

The selector 59 selects either of two kinds of control signals supplied thereto from, for example, the CPU 41 for the generation of the reference voltage depending on whether the impedance of the transmitter 50 or the receiver 51 is to be adjusted, and supplies the selected control signal to the reference voltage generator 60.

The selectors 57 to 59 are instructed by means of the selection signal from the controller 52, for example, whether the impedance of the transmitter 50 or the receiver 51 is to be adjusted.

The reference voltage generator 60 generates the reference voltage in accordance with the control signal selected by the selector 59.

The hold signal generator 61 receives the pMOS control signal and the nMOS control signal from the controller 52. Then, based on the pMOS and nMOS control signals, the reference voltage generated by the reference voltage generator 60, and the resistance of the reference resistor 32, the hold signal generator 61 generates the pMOS-side hold signal and the nMOS-side hold signal.

In the following, examples of the individual circuits will be described.

Figure 3:
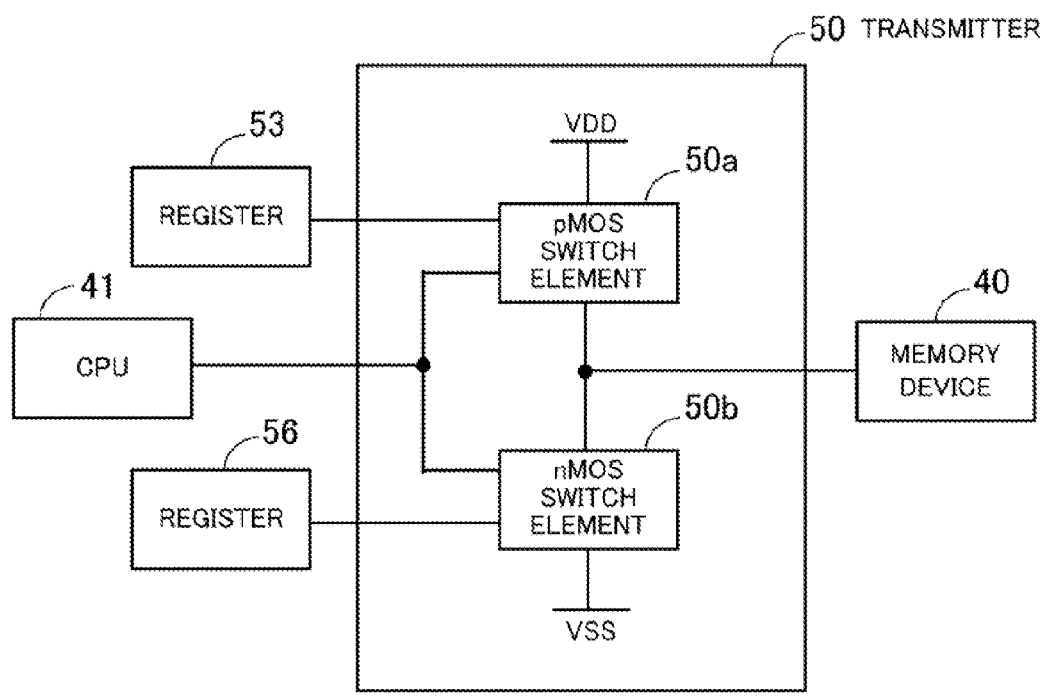
FIG. 3 illustrates an exemplary circuit of a transmitter.
Figure 4:
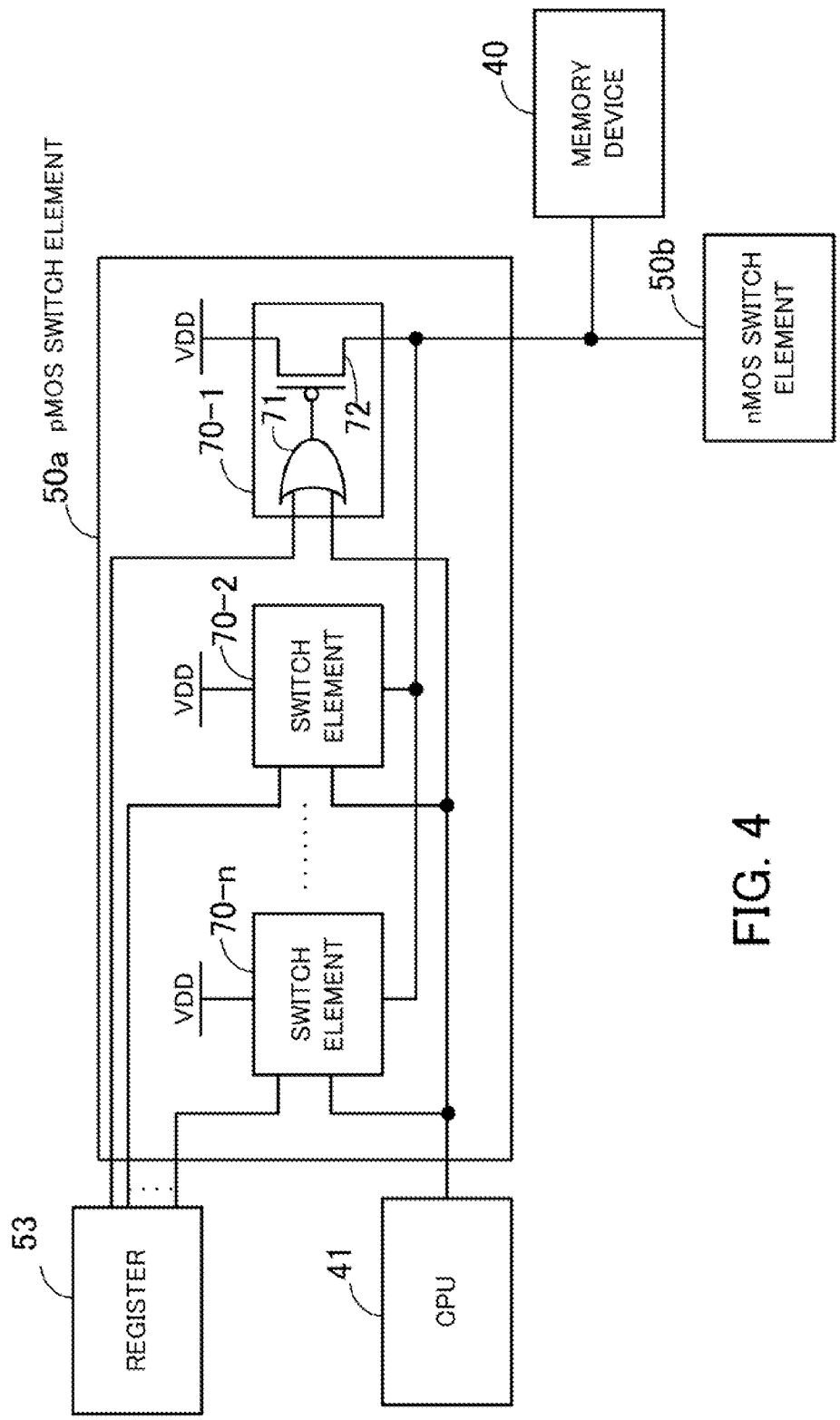
FIG. 4 illustrates an example of a pMOS switch element.
Figure 5:
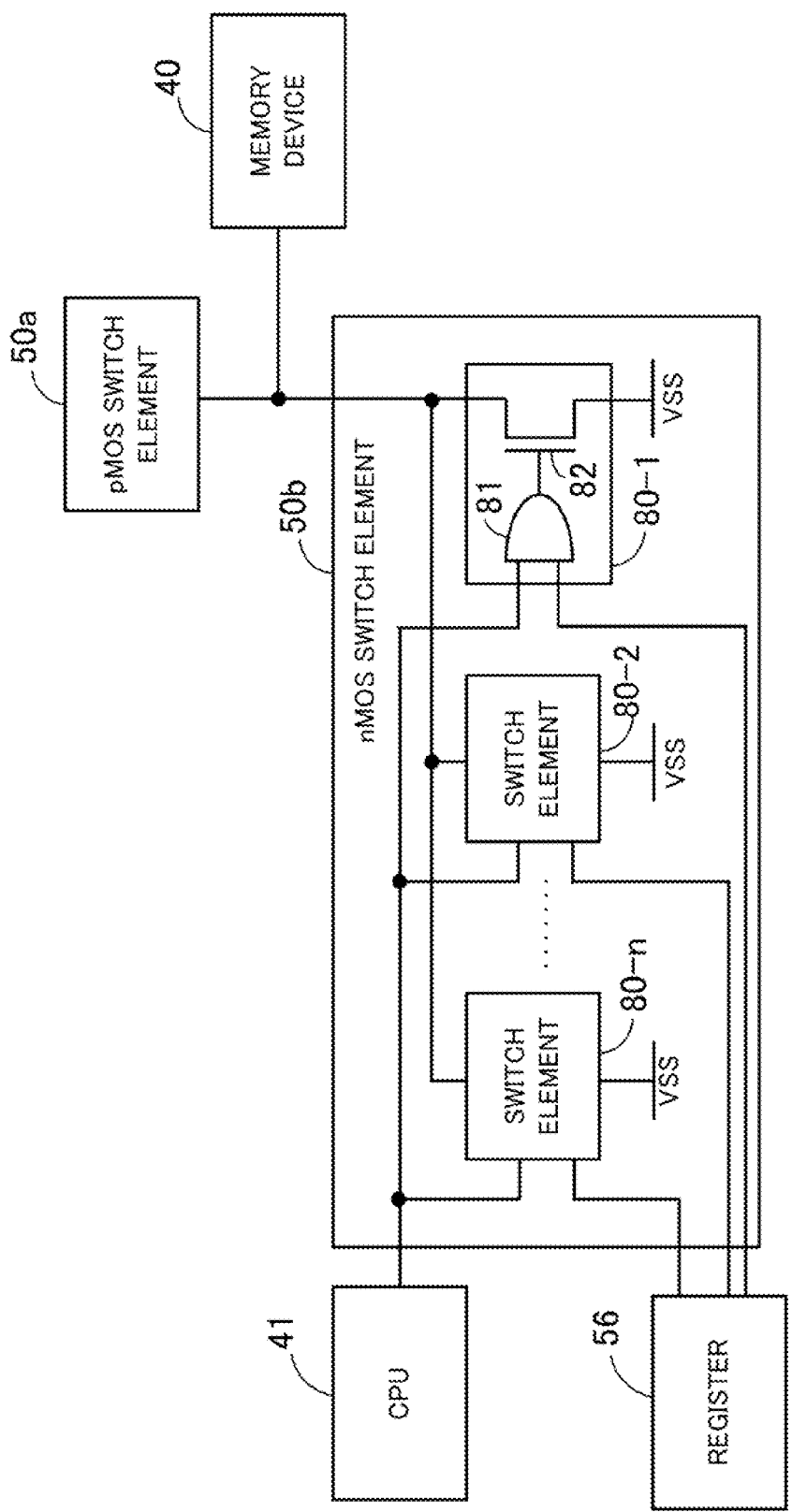
FIG. 5 illustrates an example of an nMOS switch element.

Example of Transmitter 50:

FIG. 3 is an exemplary circuit diagram of the transmitter. FIG. 4 illustrates an example of the pMOS switch element, and FIG. 5 illustrates and example of the nMOS switch element.

As illustrated in FIG. 3, the transmitter 50 includes a pMOS switch element 50a and an nMOS switch element 50b, for example. The pMOS switch element 50a has, as illustrated in FIG. 4, a plurality of switch elements 70-1, 70-2, . . . , 70-n each provided with an OR gate 71 and a pMOS 72, for example.

The OR gate 71 receives the pMOS control signal from the register 53 as well as with transmit data from the CPU 41. The OR gate 71 has an output terminal connected to the gate of the pMOS 72. The pMOS 72 has one input-and-output terminal connected to a VDD power supply, and has the other input-and-output terminal (output terminals of the switch elements 70-1 to 70-n) connected to the memory device 40 and the nMOS switch element 50b.

The switch elements 70-1 to 70-n are supplied with respective separate pMOS control signals to be controlled independently of one another. Also, common transmit data is supplied from the CPU 41 to the individual switch elements 70-1 to 70-n. The output terminals of the switch elements 70-1 to 70-n are connected together.

For example, when "1" as the pMOS control signal is input to the OR gate 71 of the switch element 70-1, the OR gate 71 outputs "1" regardless of the value of the transmit data. Consequently, the pMOS 72 turns off without regard to the value of the transmit data. That is, those switch elements which receives the pMOS control signal "1" are rendered ineffective and thus are not used.

On the other hand, when "0" as the pMOS control signal is input to the OR gate 71 of the switch element 70-1, the OR gate 71 outputs "0" if the value of the transmit data is then "0". In this case, the pMOS 72 turns on. If the value of the transmit data is "1", the OR gate 71 outputs "1", so that the pMOS 72 turns off.

As illustrated in FIG. 5, the nMOS switch element 50b has a plurality of switch elements 80-1, 80-2, . . . , 80-n each provided with an AND gate 81 and an nMOS 82.

The AND gate 81 receives the nMOS control signal from the register 56 as well as with transmit data from the CPU 41. The AND gate 81 has an output terminal connected to the gate of the nMOS 82. The nMOS 82 has one input-and-output terminal connected to a VSS power supply, and has the other input-and-output terminal (output terminals of the switch elements 80-1 to 80-n) connected to the memory device 40 and the pMOS switch element 50a.

The switch elements 80-1 to 80-n are supplied with respective separate nMOS control signals to be controlled independently of one another. Also, common transmit data is supplied from the CPU 41 to the individual switch elements 80-1 to 80-n.

For example, when as the nMOS control signal is input to the AND gate 81 of the switch element 80-1, the AND gate 81 outputs "0" regardless of the value of the transmit data. Consequently, the nMOS 82 turns off without regard to the value of the transmit data. That is, those switch elements which receives the nMOS control signal "0" are rendered ineffective and thus are not used.

On the other hand, when "1" as the nMOS control signal is input to the AND gate 81 of the switch element 80-1, the AND gate 81 outputs "0" if the value of the transmit data is then "0". In this case, the nMOS 82 turns off. If the value of the transmit data is "1", the AND gate 81 outputs "1", so that the nMOS 82 turns on.

The numbers of the switch elements 70-1 to 70-n and 80-1 to 80-n to be used are controlled by means of the pMOS and nMOS control signals, respectively, to adjust the impedances.

The following description is based on the assumption that in the case of the pMOS switch element 50a, the impedance assumed when all pMOSs are "ON" with the pMOS control signals "0" supplied to the respective switch elements is a reference impedance to be set with respect to the pMOS switch element 50a. Also, it is assumed that in the case of the nMOS switch element 50b, the impedance assumed when all nMOSs are "ON" with the nMOS control signals "1" supplied to the respective switch elements is a reference impedance to be set with respect to the nMOS switch element 50b.

The receiver 51 has a circuit configuration identical with that of the transmitter 50.

Figure 6:
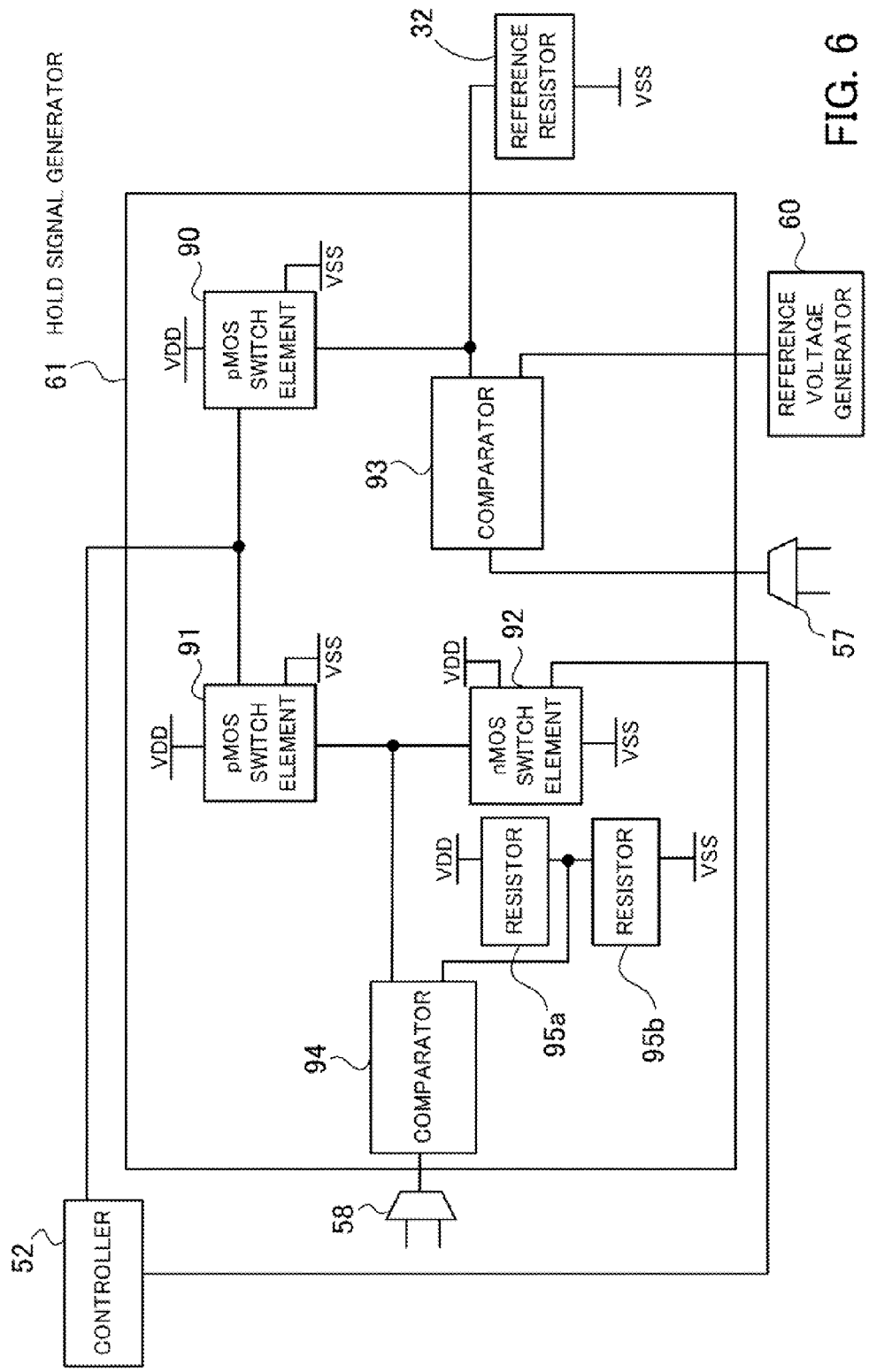
FIG. 6 illustrates an example of a hold signal generator.

Example of Hold Signal Generator 61:

FIG. 6 illustrates an example of the hold signal generator. The hold signal generator 61 includes pMOS switch elements 90 and 91, an nMOS switch element 92, comparators 93 and 94, and resistors 95a and 95b.

Each of the pMOS switch elements 90 and 91 may be implemented using a circuit identical with the pMOS switch element 50a illustrated in FIG. 4, for example. The pMOS switch elements 90 and 91, however, receive a low-level signal (corresponding to the transmit data "0") from the VSS power supply, instead of the transmit data from the CPU 41. The impedance of each of the pMOS switch elements 90 and 91 changes as the number of the pMOSs turned on in accordance with the respective pMOS control signals from the controller 52 is adjusted. This impedance is equal to the reference impedance of the pMOS switch element 50a in the transmitter 50 or the receiver 51 when the pMOS control signals are in the same states.

The nMOS switch element 92 may be implemented using a circuit identical with the nMOS switch element 50b illustrated in FIG. 5, for example. The nMOS switch element 92, however, receives a high-level signal (corresponding to the transmit data "1") from the VDD power supply, instead of the transmit data from the CPU 41. The impedance of the nMOS switch element 92 changes as the number of the nMOSs turned on in accordance with the respective nMOS control signals from the controller 52 is adjusted. This impedance is equal to the reference impedance of the nMOS switch element 50b in the transmitter 50 or the receiver 51 when the nMOS control signals are in the same states.

The comparator 93 compares the midpoint potential between the pMOS switch element 90 and the reference resistor 32 with the reference voltage generated by the reference voltage generator 60, and outputs the pMOS-side hold signal at the time corresponding to the comparison result. The midpoint potential is determined by the voltage ratio between the pMOS switch element 90 and the reference resistor 32. For example, at the time when the midpoint potential becomes equal to the reference voltage, the comparator 93 outputs, to the selector 57, the pMOS-side hold signal for causing the register 53 or 54 to hold the then pMOS control signal.

Thus, the pMOS control signal can be held at multiple timings in accordance with the reference voltage, whereby different impedances can be set with respect to the transmitter 50 and the receiver 51 by using the common pMOS control signal.

The reference voltage is adjusted so that the hold signal may be output from the comparator 93 when the impedance of the pMOS switch element 90 is identical with that set with respect to the pMOS and nMOS switch elements 50a and 50b of the transmitter 50 or the receiver 51, as described in detail later.

The hold signal from the comparator 93 allows the register 53 or 54 to hold the pMOS control signal by means of which the impedance to be set with respect to the pMOS switch element 50a of the transmitter 50 or the receiver 51 can be obtained.

The comparator 94 compares the midpoint potential between the pMOS switch element 91 and the nMOS switch element 92 with the midpoint potential between the resistors 95a and 95b. The resistors 95a and 95b have an identical resistance value.

The midpoint potential between the pMOS switch element 91 and the nMOS switch element 92 is determined by the voltage ratio between the pMOS and nMOS switch elements 91 and 92. The resistors 95a and 95b are connected in series between the VDD power supply and the VSS power supply, and the midpoint potential is VDD/2. At the time when the midpoint potential between the pMOS and nMOS switch elements 91 and 92 becomes equal to VDD/2, the comparator 94 outputs, to the selector 58, the hold signal for causing the register 55 or 56 to hold the then nMOS control signal. That is, the nMOS-side hold signal is output at the time when the impedances of the pMOS and nMOS switch elements 91 and 92 become equal to each other.

This allows the register 55 or 56 to hold the nMOS control signal by means of which the impedance to be set with respect to the nMOS switch element 50b of the transmitter 50 or the receiver 51 can be obtained.

In this embodiment, the impedances of the pMOS and nMOS switch elements 91 and 92 are made to be equal, as stated above. The reason is that by making the impedances of the pMOS and nMOS switch elements 50a and 50b of the transmitter 50 equal to each other, the impedance assumed when "0" is input as the transmit data is made to be equal to the impedance assumed when "1" is input as the transmit data. This is also the case with the receiver 51.

Figure 7:
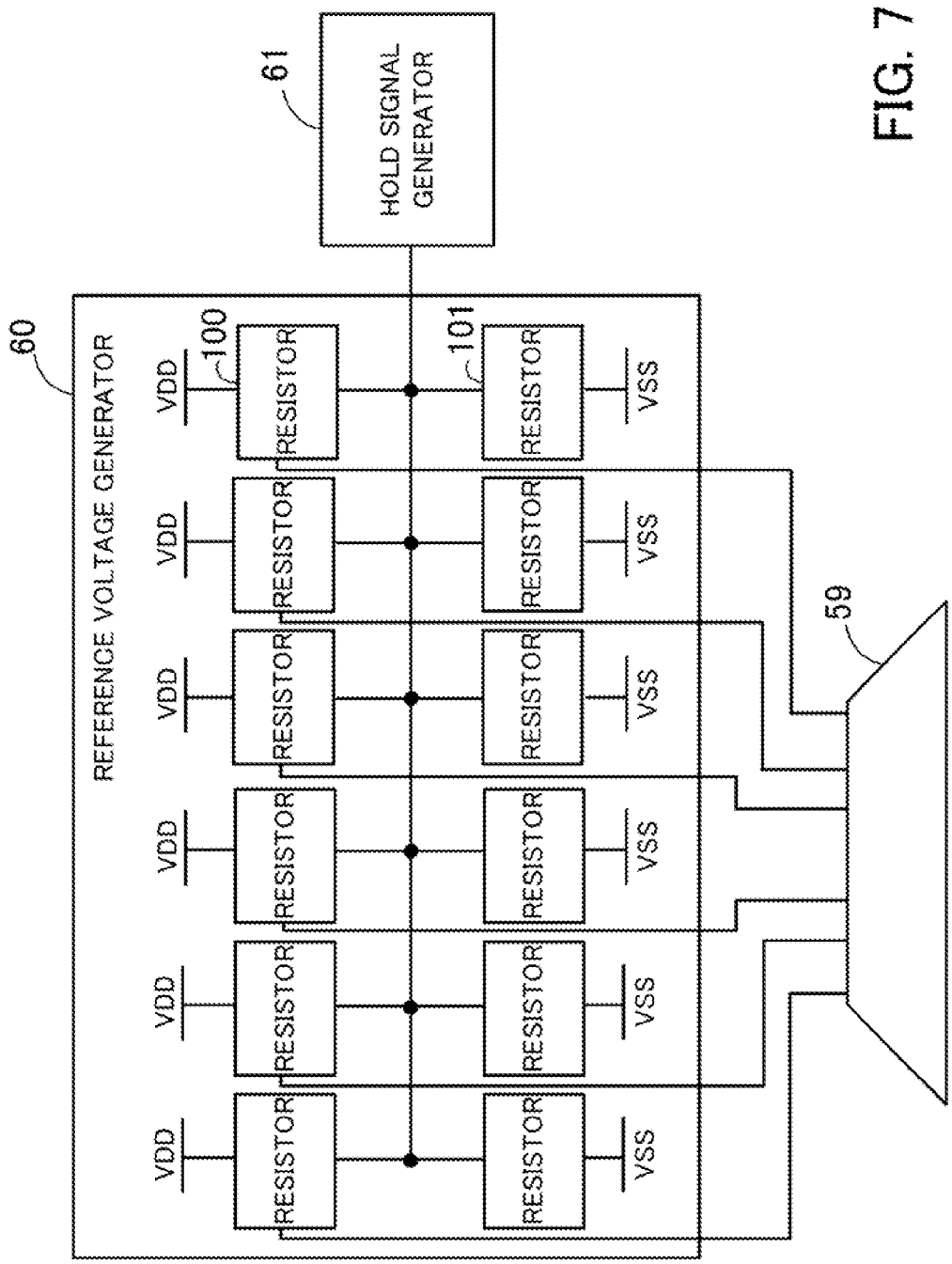
FIG. 7 illustrates an example of a reference voltage generator.

Example of Reference Voltage Generator 60:

FIG. 7 illustrates an example of the reference voltage generator.

The reference voltage generator 60 includes a plurality of pairs of resistors 100 and 101 having an identical resistance value, each pair being connected in series between the VDD power supply and the VSS power supply. In the example illustrated in FIG. 7, six pairs of resistors are provided, but the number of the pairs is not limited to six. The midpoints of the individual pairs are connected to each other, and the midpoint potential is supplied as the reference voltage to the hold signal generator 61.

Also, each resistor 100 has a switching function whereby whether to turn on or off the resistor 100 is determined in accordance with the control signal selected by the selector 59. Turning on the resistor 100 means that the resistor 100 assumes a desired resistance value, and turning off the resistor 100 means that the resistor 100 is disconnected, or in other words, the resistance value thereof is infinitely large.

The switching function is implemented using an nMOS or pMOS, for example.

The reference voltage supplied to the hold signal generator 61 is determined by the voltage ratio between the resistors 101 and the turned-on resistors 100.

The resistance values of the resistors 100 and 101 need not necessarily be the same and may be varied as needed in accordance with the reference voltage to be generated.

Example of Impedance Adjustment:

In the following, an example of how the impedances of the transmitter 50 and the receiver 51 of the semiconductor device 31 illustrated in FIG. 2 are adjusted will be explained. In the following description, the resistance value of the reference resistor 32 is assumed to be 200Ω, by way of example, and adjustments are made so that the impedances of the transmitter 50 and the receiver 51 may become equal to reference values of 240Ω and 300Ω, respectively. It is to be noted that these values are given by way of example only and are not specifically limited.

Where 240Ω is to be set as the impedance of the transmitter 50, the comparator 93 of the hold signal generator 61 illustrated in FIG. 6 receives such a reference voltage that the hold signal is output when the impedance of the pMOS switch element 90 is equal to 240 Ω.

Provided that the reference voltage applied during the impedance adjustment of the transmitter 50 is Vref1, Vref1 for obtaining 240Ω under the above conditions is given by: Vref1=(200/(240+200))×VDD=(5/11)×VDD.

In the reference voltage generator 60 illustrated in FIG. 7, when five resistors 100 are turned on while the remaining one resistor 100 is turned off in accordance with the control signal, the generated reference voltage is: (1/6/(1/5+1/6))× VDD=(5/11)×VDD, so that the above Vref1 can be obtained.

Accordingly, the CPU 41 supplies the selector 59 with a 6-bit control signal for turning on five resistors 100 and turning off the remaining one resistor 100, for example, as the control signal for adjusting the impedance of the transmitter 50. During the impedance adjustment of the transmitter 50, the controller 52 causes the selector 59 to select the above control signal by means of the selection signal, so that the reference voltage generator 60 generates the reference voltage (5/11)×VDD.

Where 300Ω is to be set as the impedance of the receiver 51, the comparator 93 of the hold signal generator 61 illustrated in FIG. 6 receives such a reference voltage that the hold signal is output when the impedance of the pMOS switch element 90 is equal to 300Ω.

Provided that the reference voltage applied during the impedance adjustment of the receiver 51 is Vref2, Vref2 for obtaining 300Ω under the aforementioned conditions is given by: Vref2=(200/(300+200))×VDD=(4/10)×VDD.

In the reference voltage generator 60 illustrated in FIG. 7, when four resistors 100 are turned on while the remaining two resistors 100 are turned off in accordance with the control signal, the generated reference voltage is: $((1/6)/(1/4+1/6)) \times VDD = (4/10) \times VDD$, so that the above Vref2 can be obtained.

Accordingly, the CPU 41 supplies the selector 59 with a 6-bit control signal for turning on four resistors 100 and turning off the remaining two resistors 100, for example, as the control signal for adjusting the impedance of the receiver 51. During the impedance adjustment of the receiver 51, the controller 52 causes the selector 59 to select the above control signal by means of the selection signal, so that the reference voltage generator 60 generates the reference voltage $(4/10) \times VDD$.

Figure 8:
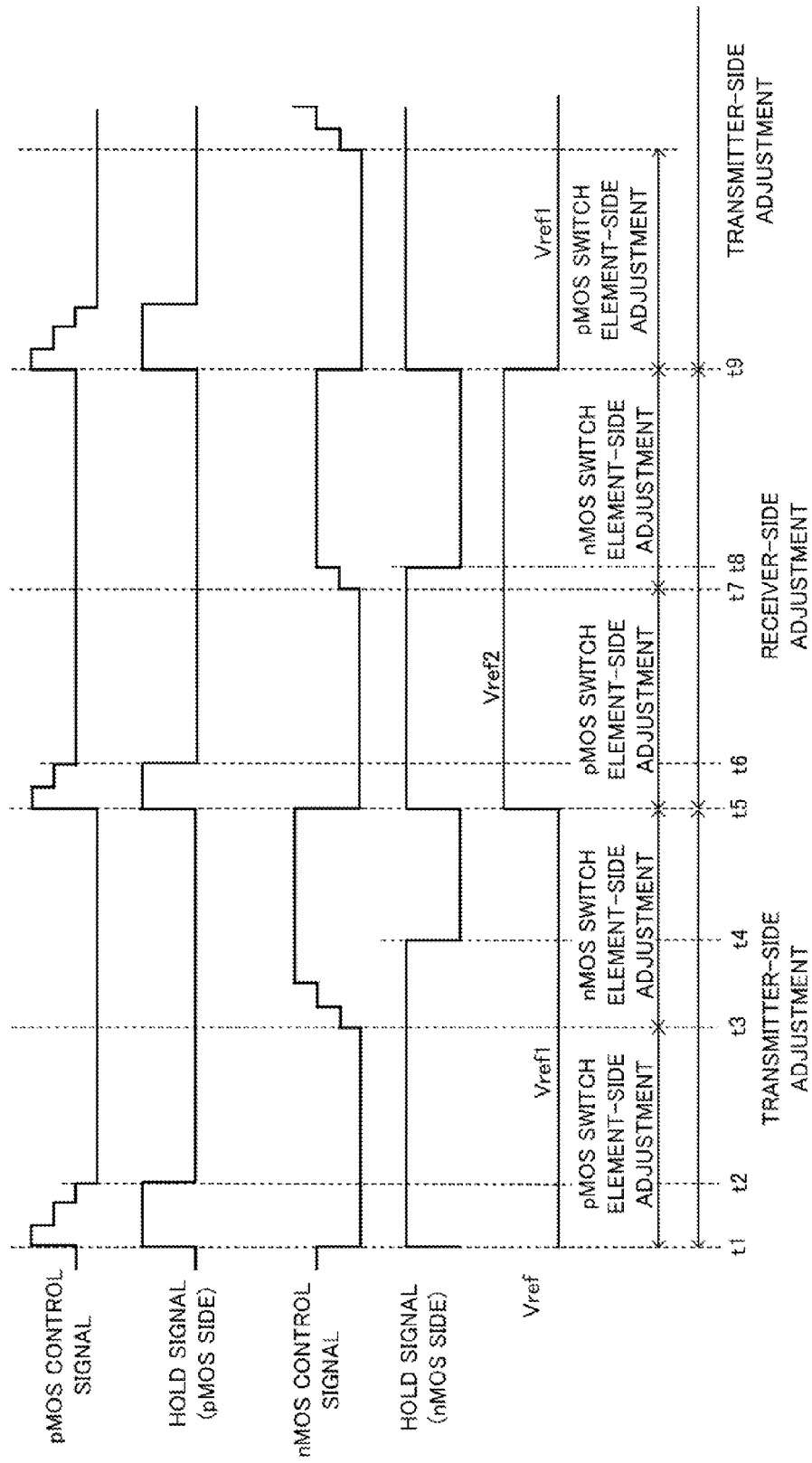
FIG. 8 is a timing chart exemplifying transitions of signals appearing at various parts during the adjustment of impedances.

FIG. 8 is a timing chart exemplifying transitions of signals appearing at various parts during the adjustment of the impedances.

In FIG. 8, the pMOS control signal, the pMOS-side hold signal, the nMOS control signal, the nMOS-side hold signal and the reference voltage Vref are illustrated from the top downward. The pMOS-side hold signal and the nMOS-side hold signal denote the hold signals input to the selectors 57 and 58, respectively, from the hold signal generator 61.

The pMOS control signal is a signal of multiple bits input to the respective switch elements 70-1 to 70-$n$ illustrated in FIG. 4, for example, and in FIG. 8, the number of the bits is schematically illustrated. Namely, the smaller the number of the bits "1", the more switch elements 70-1 to 70-$n$ are used.

Similarly, the nMOS control signal is a signal of multiple bits input to the respective switch elements 80-1 to 80-$n$ illustrated in FIG. 5, for example, and FIG. 8 schematically represents the number of the bits "1". Namely, the larger the number of the bits "1", the more switch elements 80-1 to 80-$n$ are used.

Also, in the following, an exemplary case is explained wherein the comparator 93 of the hold signal generator 61 generates a low-level pMOS-side hold signal when the midpoint potential between the pMOS switch element 90 and the reference resistor 32 reaches the reference voltage Vref, and the comparator 94 of the hold signal generator 61 outputs a low-level nMOS-side hold signal when the impedances of the pMOS switch element 91 and the nMOS switch element 92 are equal to each other. Further, it is assumed that when the pMOS-side or nMOS-side hold signal changes to the low level, the registers 53 to 56 hold the then pMOS or nMOS control signal.

First, the impedance adjustment of the transmitter 50 executed during a period from a time t1 to a time t5 will be explained.

During a period from the time t1 to the time t3, the impedance of the pMOS switch element 50a of the transmitter 50 is adjusted. First, the controller 52 progressively reduces the number of the bits "1" of the pMOS control signal. Consequently, the number of the pMOSs that are turned on in the pMOS switch elements 90 and 91 increases, so that the impedance of each of the pMOS switch elements 90 and 91 decreases, increasing the midpoint potential between the pMOS switch element 90 and the reference resistor 32. When the midpoint potential reaches the reference voltage Vref1 which has been set for adjusting the impedance of the transmitter 50, the comparator 93 outputs a low-level pMOS-side hold signal (time t2).

In the case of the impedance adjustment of the transmitter 50, the selector 57 notifies the register 53 of the change of the hold signal. The register 53 holds the then-assumed pMOS control signal. In the pMOS switch element 50a of the transmitter 50, the impedance is adjusted using the pMOS control signal held by the register 53, and in the aforementioned example, 240Ω is set as the reference impedance value.

Subsequently, during a period from the time t3 to the time t5, the impedance of the nMOS switch element 50b of the transmitter 50 is adjusted. With the pMOS control signal continuously held by the register 53, the controller 52 progressively increases the number of the bits "1" of the nMOS control signal. As a result, the number of the nMOSs that are turned on in the nMOS switch element 92 increases, so that the impedance of the nMOS switch element 92 decreases, lowering the midpoint potential between the pMOS switch element 91 and the nMOS switch element 92. When the midpoint potential reaches VDD/2, that is, when the impedance values of the pMOS and nMOS switch elements 91 and 92 become equal to each other, the comparator 94 outputs a low-level nMOS-side hold signal (time t4).

Thus, in the case of the impedance adjustment of the transmitter 50, the selector 58 notifies the register 56 of the change of the hold signal, and the register 56 holds the then-assumed nMOS control signal. In the nMOS switch element 50b of the transmitter 50, the impedance is adjusted using the nMOS control signal held by the register 56, and in the aforementioned example, 240Ω is set as the reference impedance value, as in the case of the pMOS switch element 50a.

The impedance adjustment of the receiver 51 executed during a period from the time t5 to a time t9 will be now explained.

During a period from the time t5 to the time t7, the impedance of the pMOS switch element of the receiver 51 is adjusted. The controller 52 resets the pMOS control signal to a state in which all pMOSs of the pMOS switch elements 90 and 91 are turned off, for example, and also resets the nMOS control signal to a state in which all nMOSs of the nMOS switch element 92 are turned off, for example. This causes both of the pMOS- and nMOS-side hold signals to return to the high level (time t5).

Also, when adjusting the impedance of the receiver 51, the controller 52 supplies a selection signal to the selector 59 to cause the selector 59 to select the control signal for generating the reference voltage Vref2 for the adjustment of the impedance of the receiver 51. As a result, the reference voltage Vref2 is output from the reference voltage generator 60.

Then, the controller 52 progressively reduces the number of the bits "1" of the pMOS control signal. Consequently, the impedance of each of the pMOS switch elements 90 and 91 decreases, so that the midpoint potential between the pMOS switch element 90 and the reference resistor 32 increases. When the midpoint potential reaches the reference voltage Vref2, the comparator 93 outputs a low-level pMOS-side hold signal (time t6).

In the case of the impedance adjustment of the receiver 51, the selector 57 notifies the register 54 of the change of the hold signal, and the register 54 holds the then-assumed pMOS control signal. In the pMOS switch element of the receiver 51, the impedance is adjusted using the pMOS control signal held by the register 54, and in the aforementioned example, 300Ω is set as the reference impedance value.

Subsequently, during a period from the time t7 to the time t9, the impedance of the nMOS switch element of the receiver 51 is adjusted. With the pMOS control signal continuously held by the register 54, the controller 52 progressively increases the number of the bits "1" of the nMOS control signal. As a result, the impedance of the nMOS switch element 92 decreases, so that the midpoint potential between the pMOS switch element 91 and the nMOS switch element 92 lowers. When the midpoint potential reaches VDD/2, that is, when the impedance values of the pMOS and nMOS switch elements 91 and 92 become equal to each other, the comparator 94 outputs a low-level nMOS-side hold signal (time t8).

Thus, in the case of the impedance adjustment of the receiver 51, the selector 58 notifies the register 55 of the change of the hold signal, and the register 55 holds the then-assumed nMOS control signal. In the nMOS switch element of the receiver 51, the impedance is adjusted using the nMOS control signal held by the register 55, and in the aforementioned example, 300Ω is set as the reference impedance value, as in the case of the pMOS switch element of the receiver 51.

At and after the time t9, the impedance of the transmitter 50 is again adjusted. Under the control of the controller 52, for example, the selector 59 causes the reference voltage generator 60 to alternately generate, at regular intervals of time, the reference voltage for adjusting the impedance of the transmitter 50 and the reference voltage for adjusting the impedance of the receiver 51. By repeatedly executing the impedance adjustment based on the reference voltages at regular intervals of time, the impedance adjuster 31a corrects changes in the impedances due to environmental changes (e.g., changes in the power supply voltage, temperature changes and the like). It is therefore possible to keep the impedances of the transmitter 50 and the receiver 51 at their optimum values.

The registers 53 to 56 may be additionally provided with a function of averaging the pMOS or nMOS control signals held thereby. In this case, the results of a plurality of impedance adjustments can be utilized to obtain more stable reference impedance values.

Thus, in the semiconductor device 31 and the circuit board device 30, the hold signal is supplied to the registers 53 and 56 associated with the transmitter 50 or to the registers 54 and 55 associated with the receiver 51, depending on whether the impedance of the transmitter 50 or the receiver 51 is to be adjusted. The registers 53 and 56 associated with the transmitter 50 and the registers 54 and 55 associated with the receiver 51 hold the common pMOS or nMOS control signals to permit the impedances to be adjusted. As a consequence, the impedances of the transmitter 50 and the receiver 51 can be separately adjusted by using the common pMOS and nMOS control signals, thus enabling the impedance adjustment by means of circuitry with small size.

Also, the impedances of the transmitter 50 and the receiver 51 are adjusted separately in accordance with the reference voltage value selected by the selector 59. This permits the impedances of the transmitter 50 and the receiver 51 to be set to respective different impedances best suited for the transmission and the reception, respectively. Further, the transmitter 50 and the receiver 51 need not be provided with respective independent impedance adjustment circuits and reference resistors for the impedance setting, the circuit size can be reduced, so that corresponding reduction of the power consumption may be expected.

In the above description, the CPU 41 is configured to send data to the transmitter 50 and also send, to the selector 59, the control signal corresponding to the reference voltage. The embodiment is, however, not limited to such configuration and the same function may be performed by a controller, not illustrated, of the circuit board device 30 which functions as a memory controller.

Modification:

In the hold signal generator 61 explained with reference to FIG. 6, one end of the reference resistor 32 is connected to the VSS power supply, by way of example. Where the reference resistor 32 is connected at one end to the VDD power supply, an identical function can be achieved by configuring the circuit as explained below.

Figure 9:
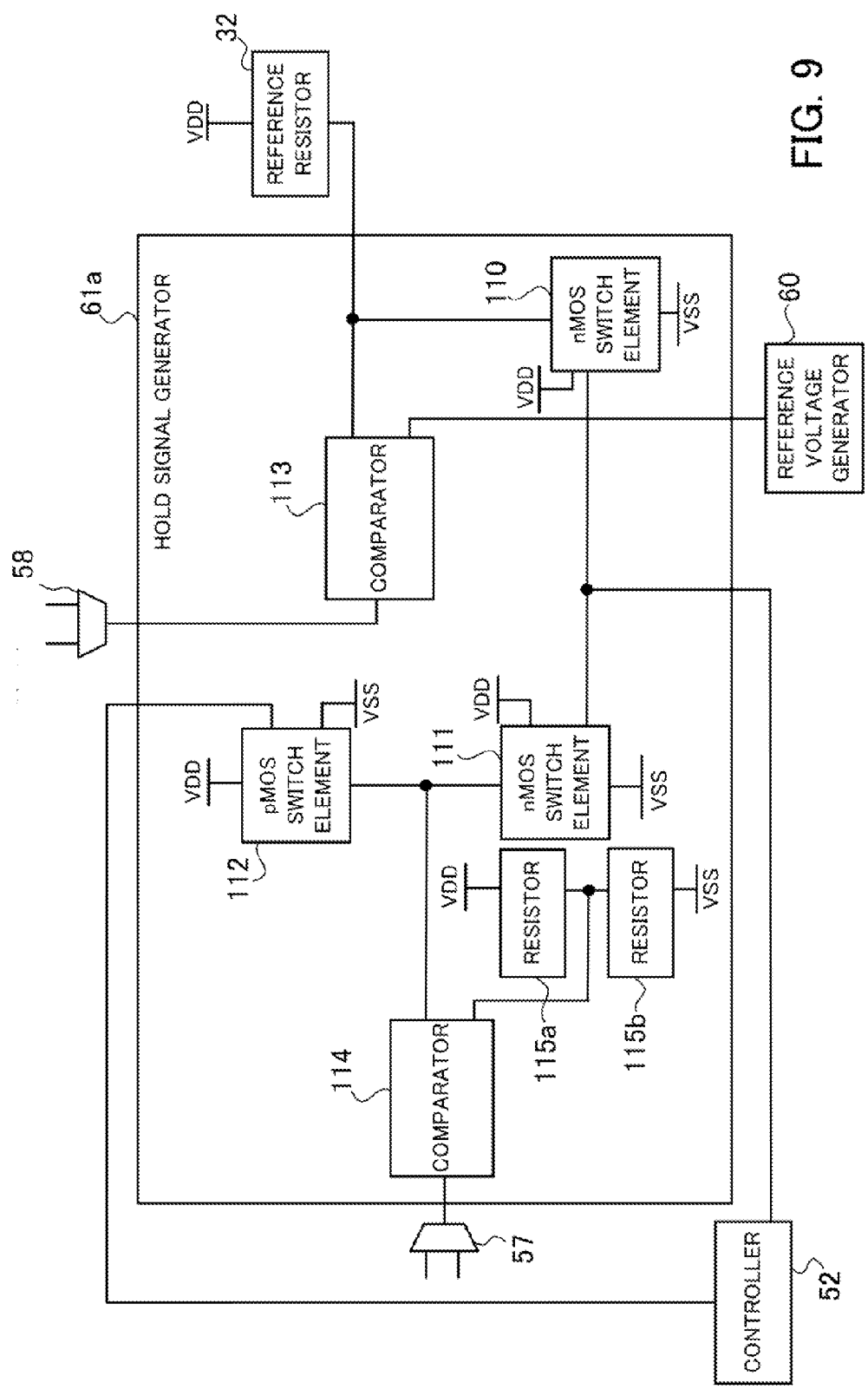
FIG. 9 illustrates a modification of the hold signal generator.

FIG. 9 illustrates a modification of the hold signal generator.

The hold signal generator 61a includes nMOS switch elements 110 and 111, a pMOS switch element 112, comparators 113 and 114, and resistors 115a and 115b.

Each of the nMOS switch elements 110 and 111 may be implemented using a circuit identical with the nMOS switch element 50b illustrated in FIG. 5, for example. The nMOS switch elements 110 and 111, however, receive a high-level signal from the VDD power supply, instead of the transmit data from the CPU 41. The impedance of each of the nMOS switch elements 110 and 111 changes as the number of the nMOSs turned on in accordance with the respective nMOS control signals from the controller 52 is adjusted. This impedance is equal to the impedance of the nMOS switch element 50b in the transmitter 50 or the receiver 51 when the nMOS control signals are in the same states.

The pMOS switch element 112 may be implemented using a circuit identical with the pMOS switch element 50a illustrated in FIG. 5, for example. The pMOS switch element 112, however, receives a low-level signal from the VSS power supply, instead of the transmit data from the CPU 41. The impedance of the pMOS switch element 112 changes as the number of the pMOSs turned on in accordance with the respective pMOS control signals from the controller 52 is adjusted. This impedance is equal to the impedance of the pMOS switch element 50a in the transmitter 50 or the receiver 51 when the pMOS control signals are in the same states.

The comparator 113 compares the midpoint potential between the nMOS switch element 110 and the reference resistor 32 with the reference voltage generated by the reference voltage generator 60. The midpoint potential is determined by the voltage ratio between the nMOS switch element 110 and the reference resistor 32. At the time when the midpoint potential becomes equal to the reference voltage, the comparator 113 outputs the nMOS-side hold signal to the selector 58.

The comparator 114 compares the midpoint potential between the nMOS switch element 111 and the pMOS switch element 112 with the midpoint potential between the resistors 115a and 115b having an identical resistance value. The midpoint potential between the nMOS switch element 111 and the pMOS switch element 112 is determined by the voltage ratio between the nMOS and pMOS switch elements 111 and 112. The resistors 115a and 115b are connected in series between the VDD power supply and the VSS power supply, and the midpoint potential is VDD/2. At the time when the midpoint potential between the nMOS and pMOS switch elements 111 and 112 becomes equal to VDD/2, the comparator 114 outputs the pMOS-side hold signal to the selector 57. That is, the hold signal for causing the register to hold the value of the pMOS control signal is output at the time when the impedances of the nMOS and pMOS switch elements 111 and 112 become equal to each other.

Thus, where the reference resistor 32 is connected at one end to the VDD power supply, the hold signal generator 61a configured as described above may be employed, whereby the same function as that of the hold signal generator 61 illustrated in FIG. 6 can be achieved.

Exemplary Mounting of Semiconductor Device 31

Figure 10:
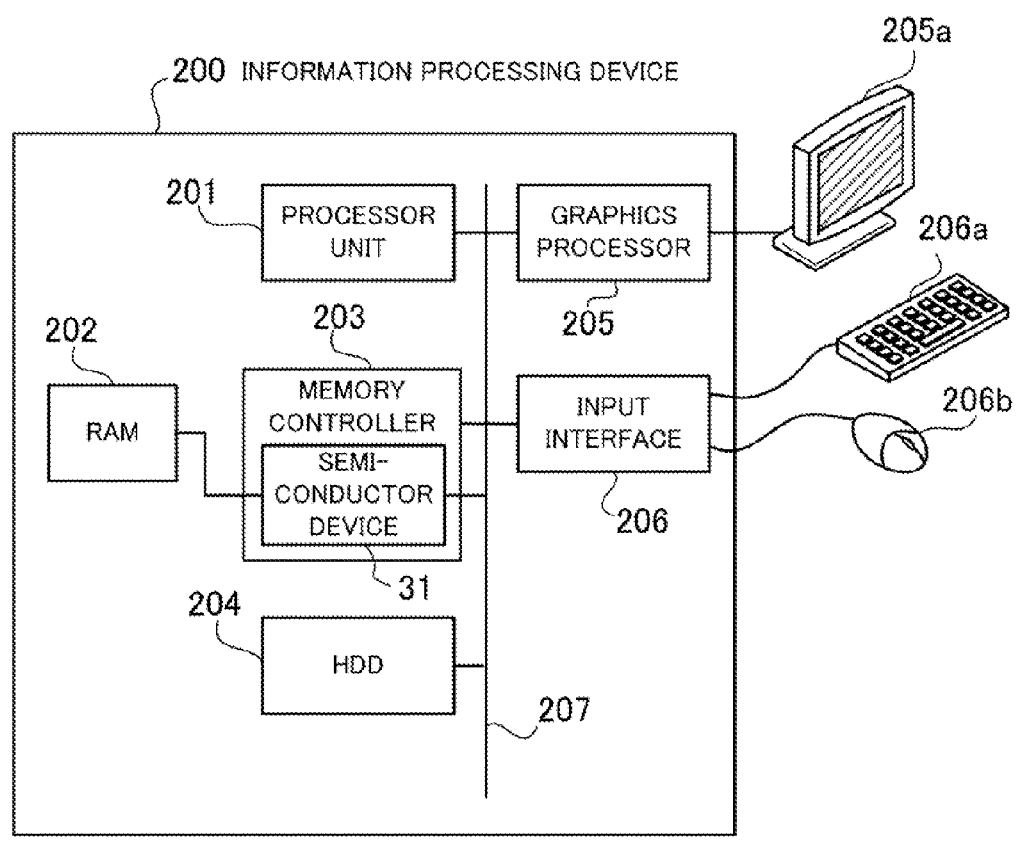
FIG. 10 exemplifies the manner of how a semiconductor device with a function of adjusting the impedances of a transmitter and a receiver is mounted.

FIG. 10 exemplifies the manner of how the semiconductor device having the function of adjusting the impedances of the transmitter and the receiver is mounted.

The semiconductor device 31 illustrated in FIG. 2 is mounted, for example, on an information processing device 200 like the one illustrated in FIG. 10. The information processing device 200 is totally under the control of a processor unit 201 such as a CPU (Central Processing Unit). The processor unit 201 is connected via a bus 207 with a memory controller 203 for controlling a RAM (Random Access Memory) 202, as well as with a plurality of peripherals.

The RAM 202 is a DDR3 SDRAM, DDR2 SDRAM or the like, for example, and is used as a main memory of the information processing device 200. The RAM 202 temporarily stores at least part of OS (Operating System) programs and application programs executed by the processor unit 201. Also, the RAM 202 stores various data used in the processing by the processor unit 201.

The memory controller 203 controls the transmission and reception of data to and from the RAM 202 under the control of the processor unit 201. The semiconductor device 31 illustrated in FIG. 2 is packaged in the memory controller 203, for example, and adjusts the impedance of the transmitter 50 for sending data to the RAM 202 as well as the impedance of the receiver 51 for receiving data from the RAM 202.

The peripherals connected to the bus 207 include, for example, an HDD (Hard Disk Drive) 204, a graphics processor 205, and an input interface 206.

The HDD 204 magnetically writes and reads data to and from a disk built therein and is used as a secondary memory of the information processing device 200. The HDD 204 stores the OS programs, application programs and various data. For the secondary memory, a semiconductor memory such as a flash memory may also be used.

The graphics processor 205 is connected with a monitor 205a. In accordance with instructions from the processor unit 201, the graphics processor 205 causes the monitor 205a to display an image on a screen thereof. For the monitor 205a, a display device using a CRT (Cathode Ray Tube), a liquid crystal display device or the like may be used.

The input interface 206 is connected with a keyboard 206a and a mouse 206b. The input interface 206 sends, to the processor unit 201, the signals received from the keyboard 206a and the mouse 206b. The mouse 206b is just an example of pointing device and some other pointing device may be used instead. Such pointing devices include a touch panel, tablet, touchpad, and trackball.

The memory controller 203 having the semiconductor device 31 packaged therein may be incorporated into the processor unit 201.

While the semiconductor device, the circuit board device and the information processing device according to one aspect of the present invention have been described above with reference to the embodiments, the foregoing description is illustrative only and the invention is not limited to the foregoing description.

For example, although in the above description, two different reference voltages Vref1 and Vref2 are generated as the reference voltages for adjusting the respective impedances of the transmitter 50 and the receiver 51, three or more different reference voltages may be generated. In such case, a selection signal specifying which of the reference voltages is to be selected may be sent from the controller 52 to the selector 59 in accordance with the impedance to be set with respect to the transmitter 50 or the receiver 51.

With the semiconductor device, circuit board device and information processing device disclosed herein, impedances can be adjusted so as to be best suited for the transmission and the reception even though the circuit used is small in size.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:

1. A semiconductor device comprising:
   a transmitter configured to transmit information;
   a receiver configured to receive information;
   a selector configured to receive a first control signal and a second control signal, and to select and output the first control signal for adjusting an impedance of the transmitter, and select and output the second control signal for adjusting an impedance of the receiver;
   a reference voltage generator configured to generate a first reference voltage based on the first control signal and a second reference voltage based on the second control signal; and
   an impedance adjuster configured to adjust the impedance of the transmitter based on the first reference voltage and the impedance of the receiver based on the second reference voltage, separately from each other.

2. The semiconductor device according to claim 1, wherein the impedance adjuster includes:
   a controller configured to output a control signal common to the transmitter and the receiver, to allow the impedance of the transmitter or of the receiver to be adjusted,
   a first register configured to hold the control signal for adjusting the impedance of the transmitter, in a manner timed to the first reference voltage generated by the reference voltage generator,
   a second register configured to hold the control signal for adjusting the impedance of the receiver, in a manner timed to the second reference voltage generated by the reference voltage generator, and
   a selector configured to select one of the first and second registers which is to hold the control signal from the controller, depending on whether the impedance of the transmitter or of the receiver is to be adjusted.

3. The semiconductor device according to claim 2, wherein the impedance adjuster further includes:
   a switch element connected to an external reference resistor and having an impedance thereof varied by the control signal from the controller; and
   a comparator configured to output a hold signal for causing the first or second register to hold the control signal at timing corresponding to a result of comparison between the reference voltage and a midpoint potential between the reference resistor and the switch element.

4. The semiconductor device according to claim 1, wherein:
   the reference voltage generator includes a plurality of pairs of resistors, each pair being connected in series between a VDD power supply and a VSS power supply,
   the individual pairs of resistors have midpoints connected to each other, and
   one of the resistors constituting each pair is turned on or off by the control signal corresponding to the reference voltage selected by the selector such that a potential at the midpoint is supplied as the reference voltage to the impedance adjuster.

5. The semiconductor device according to claim 1, wherein the selector causes the reference voltage generator to generate, at regular intervals of time, the first reference voltage for adjusting the impedance of the transmitter and the second reference voltage for adjusting the impedance of the receiver.

6. A circuit board device comprising:
a reference resistor; and
a semiconductor device including a transmitter configured to transmit information, a receiver configured to receive information, a selector configured to receive a first control signal and a second control signal, and to select and output the first control signal for adjusting an impedance of the transmitter, and select and output the second control signal for adjusting an impedance of the receiver, a reference voltage generator configured to generate a first reference voltage based on the first control signal and a second reference voltage based on the second control signal, and an impedance adjuster configured to adjust the impedance of the transmitter based on the first reference voltage and resistance of the reference resistor and the impedance of the receiver based on the second reference voltage and the resistance of the reference resistor, separately from each other.

7. An information processing device comprising:
a memory;
a processor unit; and
a semiconductor device including a transmitter configured to send information from the processor unit to the memory, a receiver configured to receive information from the memory, a selector configured to receive a first control signal and a second control signal, and to select and output the first control signal for adjusting an impedance of the transmitter, and select and output the second control signal for adjusting an impedance of the receiver, a reference voltage generator configured to generate a first reference voltage based on the first control signal and a second reference voltage based on the second control signal, an impedance adjuster configured to adjust the impedance of the transmitter based on the first reference voltage and the impedance of the receiver based on the second reference voltage, separately from each other.

* * * * *